(12) United States Patent
Swanson et al.

(10) Patent No.: US 7,971,168 B1
(45) Date of Patent: Jun. 28, 2011

(54) METHOD FOR REPEATED BLOCK TIMING ANALYSIS

(75) Inventors: Robert Swanson, Palo Alto, CA (US); Jacob Avidan, Los Altos, CA (US); Roger Carpenter, Palo Alto, CA (US)

(73) Assignee: Magna Design Automation, Inc., San Jose, CA (US)

( * ) Notice: Subject to any disclaimer, the term of this patent is extended or adjusted under 35 U.S.C. 154(b) by 473 days.

(21) Appl. No.: 12/128,919

(22) Filed: May 29, 2008

Related U.S. Application Data

(60) Provisional application No. 60/941,618, filed on Jun. 1, 2007.

(51) Int. Cl.
*G06F 17/50* (2006.01)

(52) U.S. Cl. .................. 716/113; 716/108; 716/134

(58) Field of Classification Search .................. 716/4, 5, 716/6, 7, 108, 113, 134, 139
See application file for complete search history.

(56) References Cited

U.S. PATENT DOCUMENTS

| | | | |
|---|---|---|---|
| 5,218,551 A * | 6/1993 | Agrawal et al. ................. | 716/10 |
| 5,514,884 A | 5/1996 | Hively et al. | |
| 5,778,216 A * | 7/1998 | Venkatesh ..................... | 713/503 |
| 6,346,826 B1 | 2/2002 | Chapman et al. | |
| 6,779,158 B2 * | 8/2004 | Whitaker et al. ................. | 716/3 |
| 6,993,731 B2 * | 1/2006 | Whitaker et al. ................. | 716/3 |

OTHER PUBLICATIONS

"Timing analysis speed-up using a hierarchical and a multimode approach," Blaquiere,Y.; Dagenais, M.; Savaria, Y.. Computer-Aided Design of Integrated Circuits and Systems, IEEE Transactions on, vol. 15, Issue 2, Date: Feb. 1996, pp. 244-255.

"A flexibility aware budgeting for hierarchical flow timing closure," Omedes, O.; Robert, M.; Ramdani, M. Computer Aided Design, 2004, ICCAD-2004. IEEE/ACM International Conference on, Date: Nov. 7-11, 2004, pp. 261-266.

* cited by examiner

*Primary Examiner* — Sun J Lin
(74) *Attorney, Agent, or Firm* — Kilpatrick Townsend & Stockton LLP

(57) ABSTRACT

In various embodiments, each possible different instance of a repeated block can be concurrently optimized for timing. Each instance of a repeated block may be treated as a mode, such as a functional mode or testing mode, allowing implementation calculations to be performed simultaneously. Using multimode timing analysis, all instances of a repeated block can be analyzed and optimized simultaneously. Based on the multimode analysis, instances of a repeated block may be implemented identically or substantially similarly, which can reduce costs associated with implementing the same block more than once (e.g., impact to schedule, CPU/memory resources, ECOs).

25 Claims, 8 Drawing Sheets

METHOD FOR REPEATED BLOCK TIMING ANALYSIS

CROSS-REFERENCES TO RELATED APPLICATIONS

This application claims the benefit of and priority to U.S. Provisional Patent Application No. 60/941,618, filed Jun. 1, 2007 and entitled "METHOD FOR REPEATED BLOCK TIMING ANALYSIS," the entire disclosure of which is herein incorporated by reference for all purposes.

BACKGROUND OF THE INVENTION

This disclosure relates generally to the field of chip design. More particularly, this disclosure relates to techniques for timing analysis of repeated blocks.

Semiconductor chips can be composed of complex electronic circuit arrangements. With each progressive generation of semiconductor technology, the number of components on a single chip may exponentially increase. The number of devices found on a chip, as well as their close proximity, can drive significant effort in analysis. One key aspect of analysis may be the determination of relative delays. Another may be ensuring that all timing requirements can be met on chip. Yet another may be implementing the layout of all the devices on chip. The relative placement of the devices can require significant computation resources, as each cell must be selected, placed, and routed to across the entire chip.

Often times, a soft macro or block can be implemented more than once on chip. These multiple instances can be referred to as repeated blocks. If each instance of a repeated block is implemented independently, then the different timing and layout optimizations may cause the instances to be different. These differences may cause the implementation calculations, such as the timing analysis, to be repeated for each repeated instance of a repeated block. Additionally, the cell selection, placement, and associated routing all may be repeated for each instance of the repeated block. Therefore, all of these calculations can require computing resources and time, both of which may become a significant concern as chips become larger and more complex.

Furthermore, if the instances of a repeated block are all implemented independently, the differences can create debug problems, as each instance will likely have different properties. With independent implementations there may actually be problems where one instance would work and another instance would not work properly. Additionally, the differences between instances of repeated blocks can also be problematic whenever a modification is required in a repeated block. A modification, also often referred to as an Engineering Change Order (ECO), likely must be implemented on each and every instance. Moreover, verification also can become a problem for repeated blocks, since each verification step likely must be repeated on each instance.

Accordingly, what is desired are improved methods and apparatus for solving some of the problems discussed above. Additionally, what is desired are improved methods and apparatus for reducing some of the drawbacks discussed above.

BRIEF SUMMARY OF THE INVENTION

Systems and methods can be provided for repeated block timing analysis. Elements of an integrated circuit, such as soft macros, may be implemented more than once as repeated blocks. Each instance of a repeated block may include different timing and layout optimizations that cause the instances to be initially different. In various embodiments, each possible different instance of a repeated block can be concurrently optimized for timing.

In some embodiments, each instance of a repeated block may be treated as a mode, such as a functional mode or testing mode, allowing implementation calculations to be performed simultaneously. Each instance of a repeated block may be associated with a different environment or mode. Requirements, constraints, attributes, etc. of an instance of a repeated block maybe included with any requirements, constraints, attributes, for the instance's mode. Using multimode timing analysis, all instances of a repeated block can be analyzed and optimized simultaneously.

In further embodiments, instances of a repeated block may be implemented identically, reducing the differences between instances that can add to the cost of implementing the same block more than once (e.g., impact to schedule, cpu/memory resources, ECO) in addition to debug problems. With identical or substantially identical implementations that meet all of the timing requirements of each instance of a repeated block, modifications that may be required in a repeated block can be more readily implemented. Thus, ECOs can be implemented on each and every instance, verification can be improved, and each instance is more likely to function properly. Accordingly, a single design for an integrated circuit chip may be generated that meets all of the timing constraints for each implementation of a repeated block and that utilizes identical or substantially similar designs for each implementation of a repeated block.

A further understanding of the nature and the advantages of those inventions disclosed herein may be realized by reference to the remaining portions of this disclosure and any accompanying drawings.

BRIEF DESCRIPTION OF THE DRAWINGS

In order to better describe and illustrate embodiments and/or examples of those inventions disclosed herein, reference may be made to one or more accompanying drawings. The additional details or examples used to describe the accompanying drawings should not be considered as limitations to the scope of any of the disclosed inventions, the presently described embodiments and/or examples, and the presently understood best mode of these inventions.

DETAILED DESCRIPTION OF THE INVENTION

In various embodiments, a soft macro or block can be implemented more than once on chip as repeated blocks. Each instance of a repeated block can be implemented taking into account the different timing and layout optimizations that cause the instances to be different. Each instance of a repeated block may be treated as a mode, such as a functional mode or testing mode, allowing implementation calculations to be performed simultaneously. Each instance of a repeated block may be associated with a different environment or mode. Requirements, constraints, attributes, etc. of an instance of a repeated block may be included with any requirements, constraints, attributes, or the like, for the mode. Using multimode timing analysis, all instances of a repeated block can be analyzed and optimized simultaneously.

Furthermore, each instance of a repeated block may be implemented identically, reducing the differences between instances that can create debug problems. With substantially identical implementations, modifications that may be required in a repeated block can be more readily implemented. Thus, ECOs can be implemented on each and every instance, verification can be improved, and each instance is more likely to function properly. Accordingly, a single repeated block design for an integrated circuit chip may be generated that meets all of the timing constraints for each instance of a repeated block and that utilizes similar or identical designs for each implementation of a repeated block.

Figure 1:
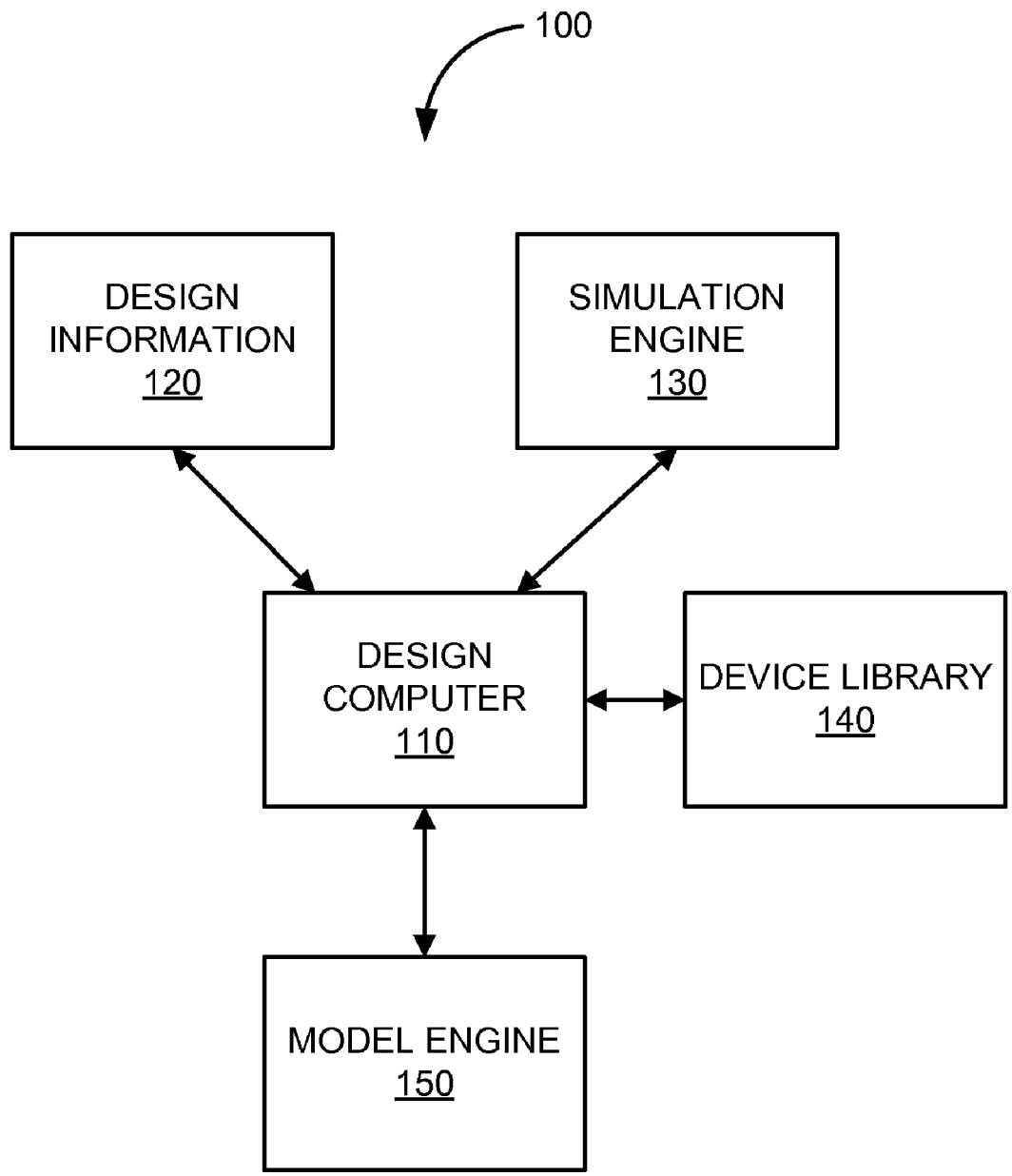
FIG. 1 is a simplified block diagram of an electronic design automation system that may be used to perform repeated block timing analysis in one embodiment of the present invention.

FIG. 1 is a simplified block diagram of electronic design automation (EDA) system 100 that may be used to perform repeated block timing analysis in one embodiment of the present invention. System 100 can include design computer 110 coupled to design information 120, simulation engine 130, device library 140, and model engine 150.

In various embodiments, a user may interact with or otherwise use design computer 110 to design and produce electronic systems ranging from printed circuit boards (PCBs) to integrated circuits. The user may use design computer 110 (along with design information 120, simulation engine 130, device library 140, and model engine 150) of system 100 to perform co-design and architecture of packages and integrated circuits.

In some embodiments, the user may interact with or otherwise use design computer 110 to perform design tasks, such as floorplanning, placement, routing, or other steps for creating an integrated circuit. In one embodiment, a design may be created showing the expected locations for gates, power and ground planes, I/O pads, soft/hard macros, blocks, or the like. System 100 may perform logic synthesis, such as the translation of a chip's abstract, logical RTL-description into a discrete netlist of logic-gate (Boolean-logic) primitives.

System 100 may simulate a circuit's operation so as to verify correctness and performance. In another example, system 100 provides low-level transistor-simulation of a schematic/layout's behavior. In yet another example, system 100 may provide a digital-simulation of an RTL or gate-netlist's digital behavior. System 100 may further provide a high-level simulation of a design's architectural operation, or employ the use of special purpose hardware to emulate the logic of a proposed design.

In various embodiments, system 100 may include one or more tools to perform repeated block analysis. Each instance of a repeated block may be treated as a mode, such as a functional mode or testing mode, allowing implementation calculations to be performed simultaneously. Using multimode timing analysis, all instances of a repeated block can be analyzed and optimized simultaneously. Furthermore, each instance of a repeated block may be implemented identically, reducing the differences between instances that can create debug problems. System 100 may generate a layout for instances of repeated blocks that meets the timing requirements of the repeated blocks. System 100 may include substantially similar implementations of each repeated block in the design.

Figure 2:
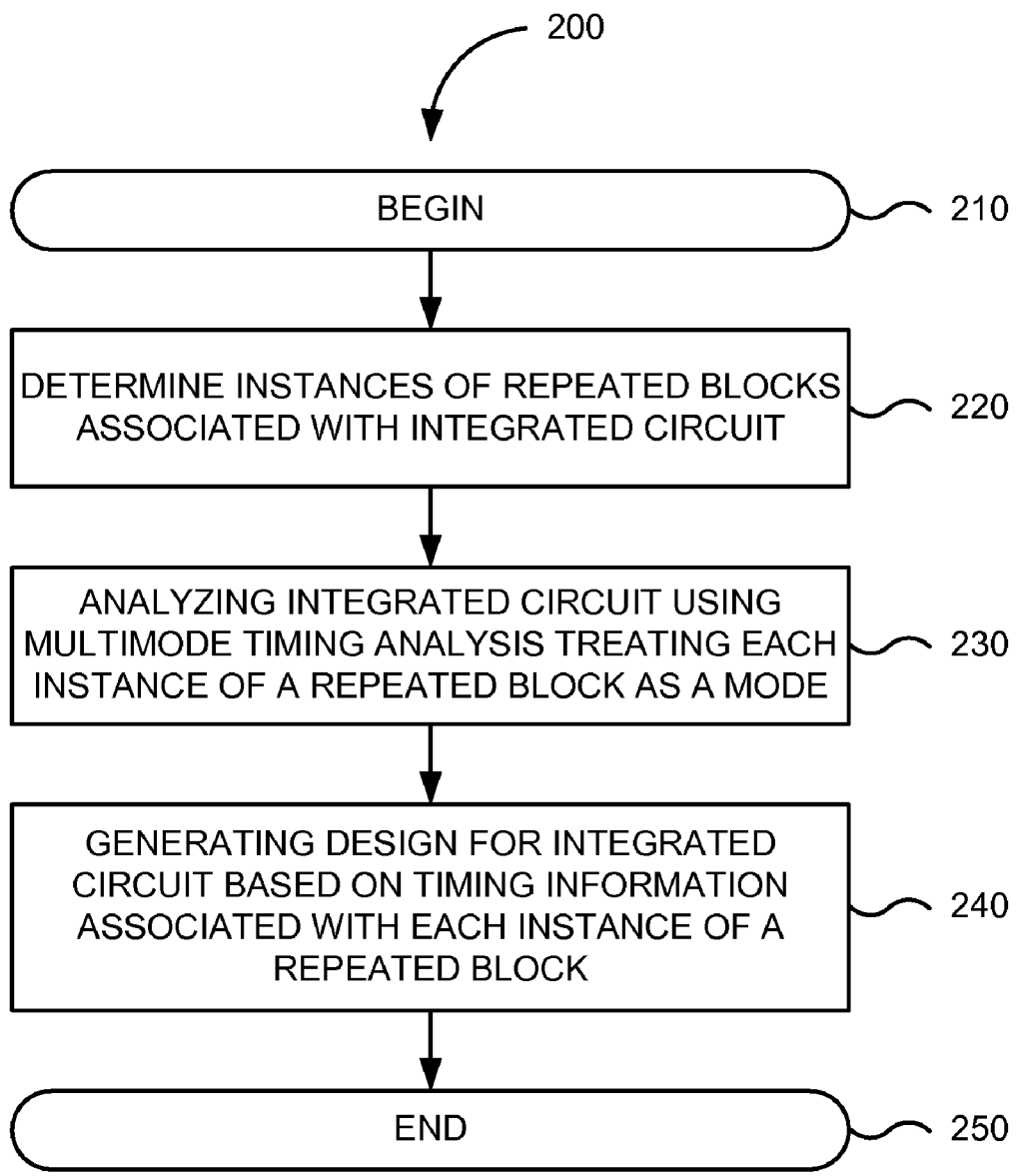
FIG. 2 is a simplified flowchart of a method for designing an integrated circuit using repeated block timing analysis in one embodiment according to the present invention.

FIG. 2 is a simplified flowchart of method 200 for designing an integrated circuit using repeated block timing analysis in one embodiment according to the present invention. The processing depicted in FIG. 2 may be performed by software modules (e.g., instructions or code) executed by a processor of a computer system, by hardware modules of the computer system, or combinations thereof. FIG. 2 begins in step 210.

In step 220, instances of repeated blocks associated with an integrated circuit are determined. For example, system 100 may determine whether a soft macro or block may be implemented more than once in a design, layout, or other specification of an integrated circuit. System 100 may group multiple instances of a block as a repeated block. System 100 may further determine information associated with the instances of repeated blocks, such as timing requirements, constraints, properties, attributes, or the like.

Figure 3:
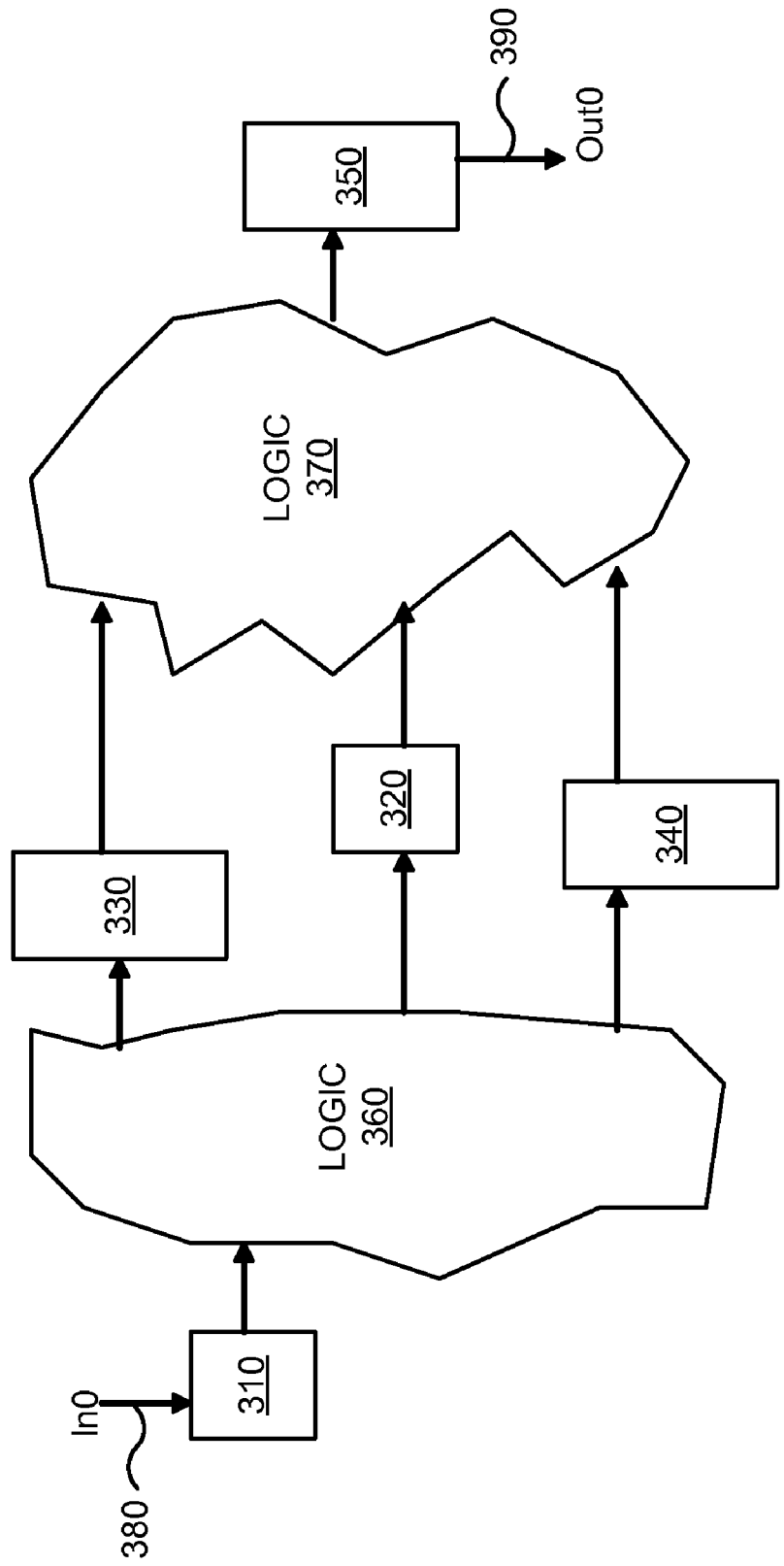
FIG. 3 is a logic diagram of repeated blocks and surrounding logic on an integrated circuit in one embodiment according to the present invention.

FIG. 3 is a logic diagram of repeated blocks and surrounding logic on an integrated circuit in one embodiment according to the present invention. In this example, blocks 310 and 320 can include instances of one repeated block. In other words, blocks 310 and 320 represent instances of the same macro, cell, etc. Blocks 330, 340, and 350 can include instances of another repeated block. Logic 360 and logic 370 may include other on-chip logic. This other on-chip logic may include combinational logic and/or sequential logic.

It is likely that the inputs to block 310 (represented by In0 380) and the inputs to block 320 may have different timings. Similarly, the inputs to blocks 330, 340, and 350 may have different timings. Likewise, it is likely that the outputs of block 310 and the outputs of block 320 may have differing timing requirements. Again, the outputs of blocks 330, 340, and 350 (representing by Out0 390) may have different timings. The different timing requirements of an input/output of an individual instance may be included in information about the instance.

Figure 4:
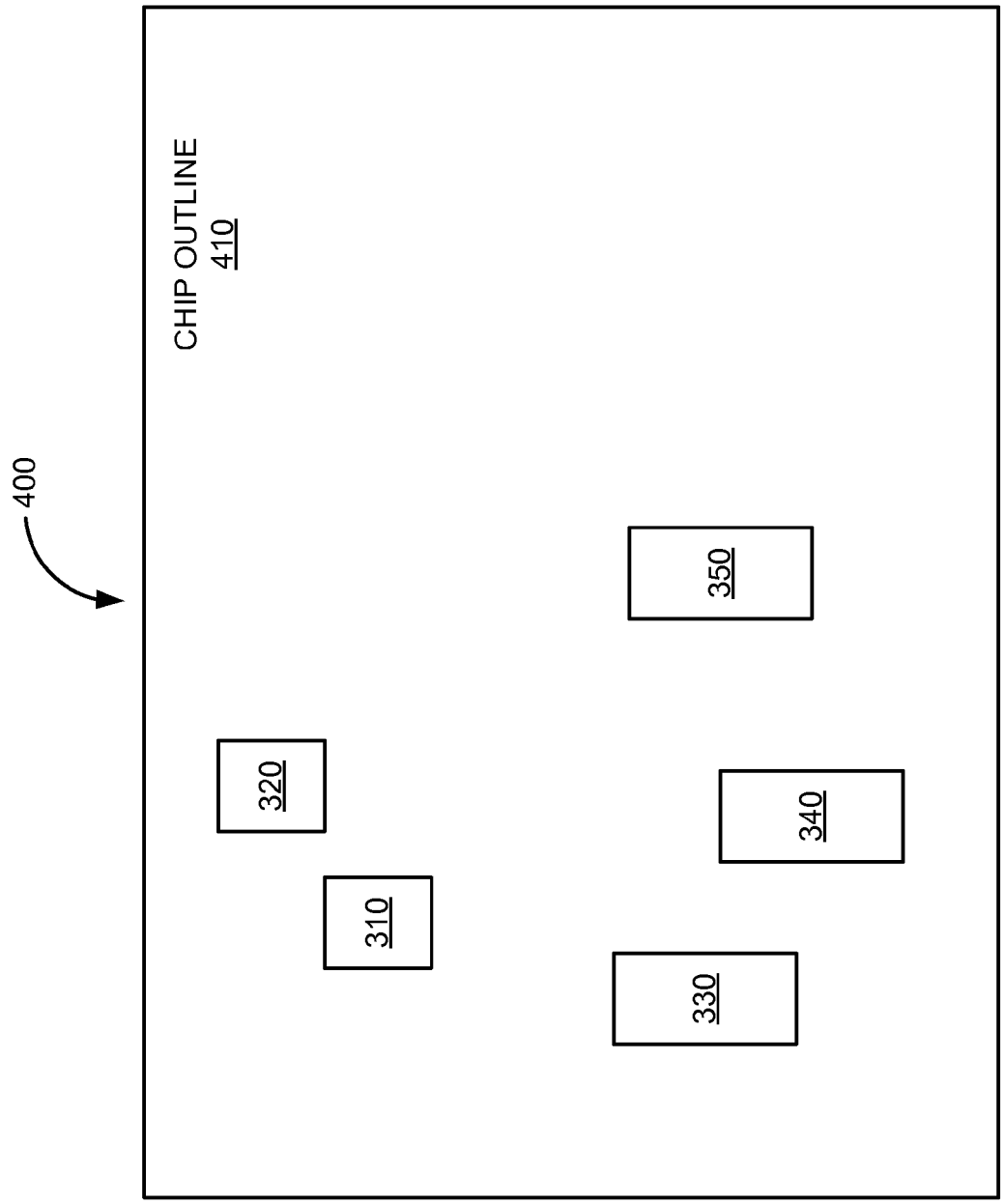
FIG. 4 is an illustration of a chip layout representation for a possible repeated block placement in one embodiment according to the present invention.

FIG. 4 is an illustration of chip layout representation 400 for a possible repeated block placement in one embodiment according to the present invention. Chip layout representation 400 includes chip outline 410. Chip outline 410 may enclose one or more instances of repeated blocks (e.g., blocks 310 and 320, as well as blocks 330, 340, and 350 of FIG. 3). Due to differing placement of repeated blocks 330, 340, and 350, for example, the expected timing environments for each individual block may be different. These different timing environments may include differing time of flight delays to the inputs, as well as differing capacitive loads on the outputs in the information about each instance.

Referring again to FIG. 2, in step 230, the integrated circuit is analyzed using multimode timing analysis treating each instance of a repeated block as a mode. For example, system 100 may treat the different timing environments, requirements, constraints, or attributes of each instance of a repeated block as different modes. The different modes may be analyzed simultaneously considering all of the instances of a repeated block. Repeated block instance modes may be one dimension for multimode analysis while test and functional modes, by way of example, are considered another dimension of multimode analysis.

In step 240, a design is generated for the integrated circuit based on timing information associated with each instance of a repeated block. Thus, system 100 may implement designs for the instances of a repeated block such that the instances can meet all of the timing requirements for each instance. System 100 may further ensure that each of the implemented designs for instances of a repeated block are identical. Accordingly, in various embodiments, ECOs may be implemented quickly and across all identical or substantially identical portions of instances of repeated blocks. FIG. 2 ends in step 250.

Figure 5:
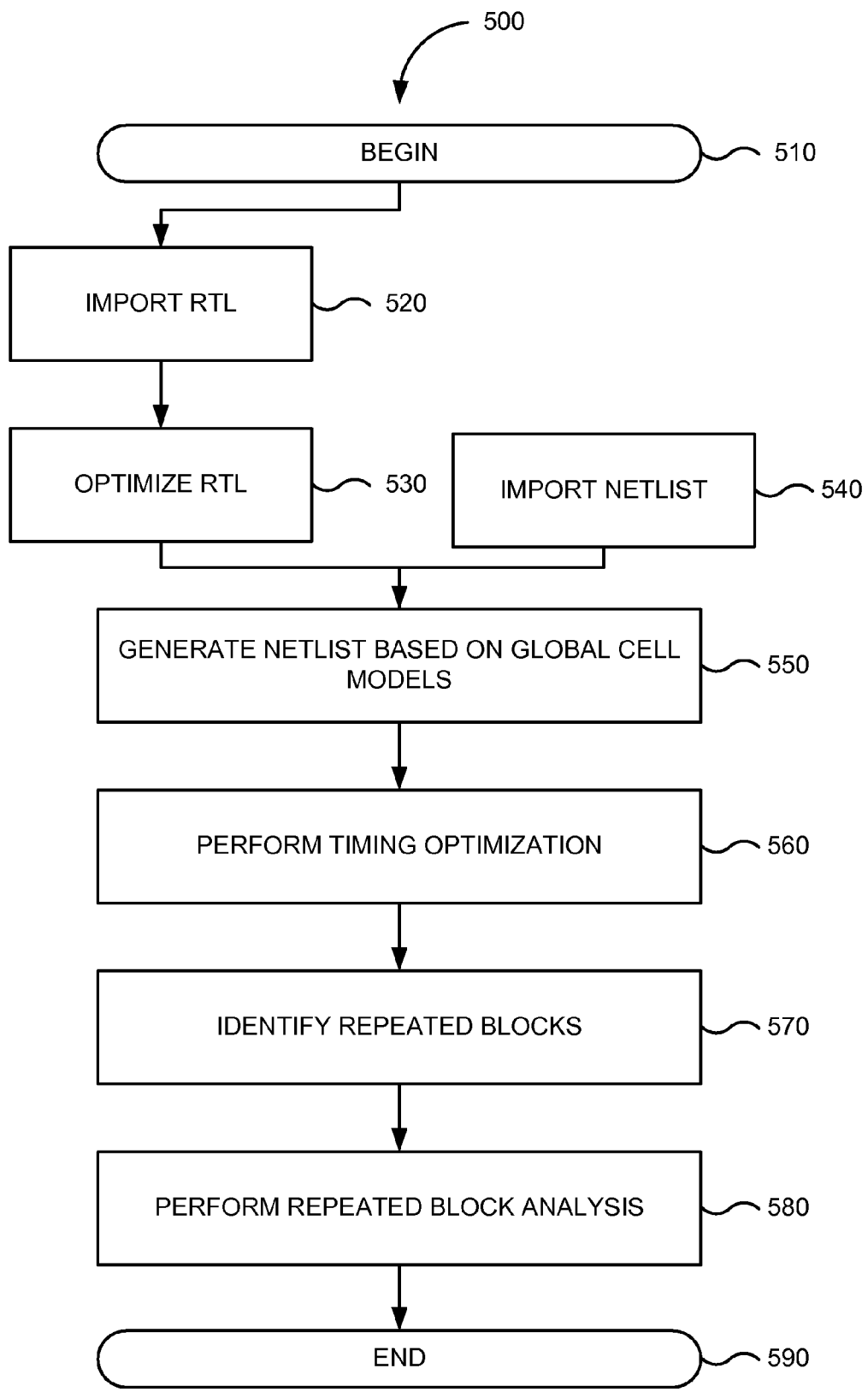
FIG. 5 is a flowchart of a method for repeated blocks timing analysis in one embodiment according to the present invention.

FIG. 5 is a flowchart of method 500 for repeated blocks timing analysis in one embodiment according to the present invention. FIG. 5 begins in step 510.

In step 520, an Register Transfer Level (RTL) specification is imported. The RTL specification may define one or more digital circuits as a collection of registers, Boolean equations, control logic (such as "if-then-else" statements), as well as complex event sequences. Some examples of RTL languages are VHDL and Verilog. In step 530, the RTL specification is optimized. The RTL specification may be turned into a design in one or more gate-level netlists. In some embodiments, this step may be referred to as "fix rtl." Alternatively, in step 540, a netlist is imported.

In step 550, a netlist is generated based on global cell models. In some embodiments, this step may be referred to as "fix netlist." For example, the RTL specification may turned into an netlist based on the global cell models. In another example, the imported netlist may be modified based on the global cell models. The netlist may include connectivity information, instances, nets, and/or attributes. In step 560, timing optimization is performed. One or more elements may be updated, modified, added, removed, etc. in the netlist based on the timing optimization.

At this point, any repeated blocks within a design may be identified. Accordingly, in step 570, repeated blocks are identified. Instances of repeated blocks may include identical or substantially identical implementations. Requirements, constraints, properties, and preferences of instances of a repeated block may be stored for further analysis. In step 580, repeated blocks optimization is performed. System 100 may perform repeated block optimization utilizing one or more analyses. System 100 may determine timing violations, enforce constraints, satisfy relationships, or the like. Some examples of repeated block optimization using multimode timing analysis are described further with respect to FIGS. 6 and 7. FIG. 5 ends in step 590.

Figure 6:
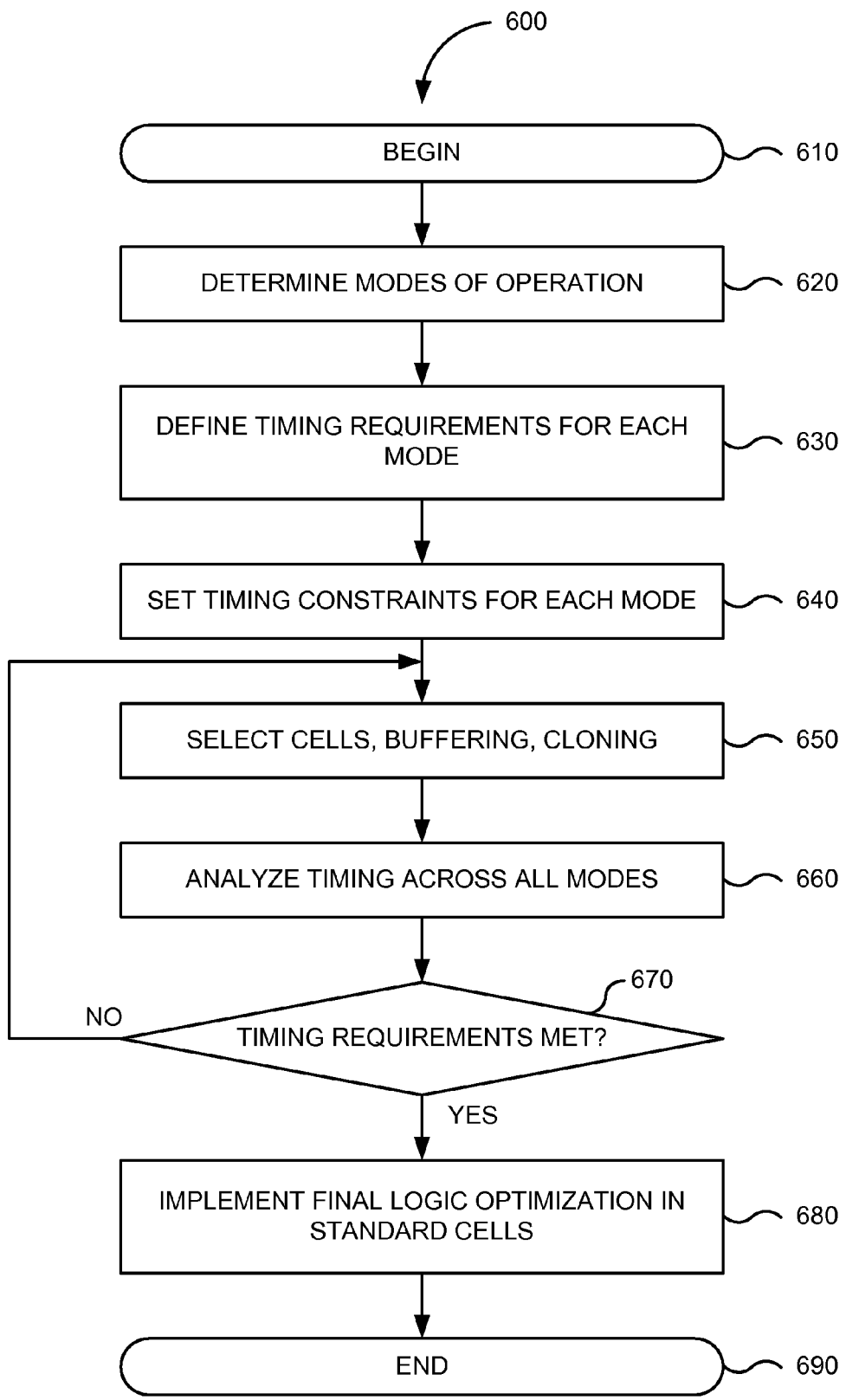
FIG. 6 is a flowchart of a method for multimode timing analysis which may be used for repeated blocks timing analysis in one embodiment according to the present invention.

FIG. 6 is a flowchart of method 600 for multimode timing analysis which may be used for repeated blocks timing analysis in one embodiment according to the present invention. FIG. 6 begins in step 610.

In step 620, one or more modes of operation are determined. The one or more modes of operation can represent various modes within which circuitry may operate. Each of the one or more modes may have different environments, requirements, constraints, attributes, parameters, or the like. Some possible modes may include functional modes and test modes, for example.

In step 630, timing requirements are defined for each mode in the one or more modes. For example, each of the one or more modes may include different timing requirements. Requirements, constraints, or the like, may conflict from one mode to another. The timing requirements may include the needed input and output timings defined for each cell for each mode. In some embodiments, the timing requirements may be input individually or may be read in from a timing file. In one example, the timing constraints may be defined using a timing optimization tool. In step 640, timing constraints are set for each mode in the one or more modes.

In step 650, cells are selected, buffering implemented, and cloning performed. For example, a tool may be used to specify the logic optimization and specific logic cell implementation. The logic optimization and specific logic cell implementation may be used to improve the timing result of circuitry. In step 660, timing is analyzed across all modes. In various embodiments, each mode can be analyzed concurrently. In some embodiments, a unified model may be analyzed that was generated from each mode. Accordingly, for each mode in the one or more modes, timing constraints for each logic cell may be analyzed simultaneously.

Analyzing all modes may be referred to as multimode timing analysis. Historically, attempts at timing analysis did not consider all modes simultaneously, which may be a key benefit of multimode timing analysis. These previous attempts implement a slow iterative process, which may not scale as the size and complexity of a digital circuit increases.

In step 670, a determination is made whether the timing requirements have been met. For example, a determination may be made whether the specific optimization, such as modifying cells, buffering, or cloning improve delay or in another way meet the timing requirements. In various embodiments, the path with the worst timing slack may be evaluated and optimized as needed. If the timing requirements have not been met, the processing returns to step 650, where the process of selecting cells, buffering and cloning may be repeated as needed to improve the timing.

In various embodiments, any needed circuitry may be implemented in the design at this point. Further information may be made available in the design, such as additional placement information. Based on this further information, the process of timing optimization may be implemented as needed. Those skilled in the art understand that timing analysis may continue through each step in the design process and improvements may continue to be implemented the design to meet the timing requirements.

If the timing requirements have been met, in step 680, final logic optimization may be implemented in standard cells. FIG. 6 ends in step 690.

Figure 7:
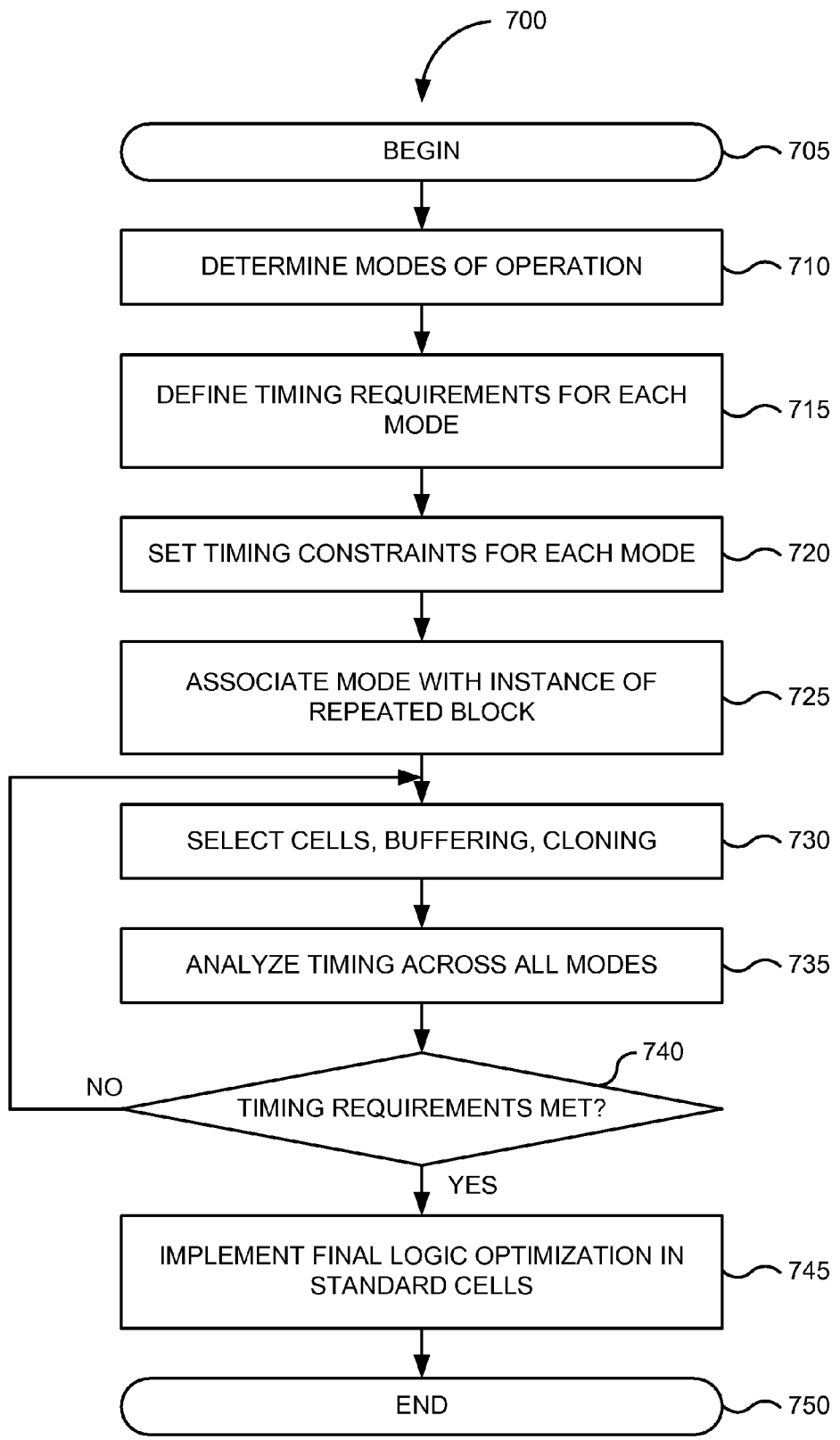
FIG. 7 is a flowchart of a method for using multimode timing analysis to implement repeated blocks in one embodiment according to the present invention.

FIG. 7 is a flowchart of method 700 for using multimode timing analysis to implement repeated blocks in one embodiment according to the present invention. FIG. 7 begins in step 705.

In step 710, one or more modes of operation are determined. As discussed above, the one or more modes of operation can represent various modes within which circuitry may operate. In step 715, timing requirements are defined for each mode in the one or more modes. The timing requirements may be defined by a user or provided via a device library. In step 720, timing constraints are set for each mode in the one or more modes.

In step 725, each mode in the one or more modes is associated with an instance of a repeated block. As discussed above, each instance of a repeated block may be considered as a mode. Timing constraints for each instances may be added to timing constraints for that instance's mode, if present. In some embodiments, each instance can have its timing constraints considered as a mode to optimize the repeated block to provide an implementation of a block that can be repeated identically or substantially identically for each instance of the repeated block on the chip. Thus, identical instance of a repeated block may be placed in a design to satisfy all of the timing requirements of each instance.

In various embodiments, some of the multimode timing constraints can be merged or compressed into a smaller set to reduce the amount of effort required for repeated block multimode timing analysis. For example, method 700 may include an optional step after step 725 that performs repeated block mode compression. Block information may be compressed, for example, if multiple blocks share the same clock constraints and share the same signal tie states. If these constraints and states are shared, further possible compression analysis may be performed. For example, comparison may be performed on one or more of arrival time, required time, signal load, signal slew rate, or the like. Required time may be defined as the time that an output is required in order to meet the next block's setup requirement. If a comparison shows that the numbers are within a certain threshold then the worst case repeated block mode can be retained while the other block modes are removed from the timing constraints. A further embodiment can consider false paths, multi-cycle paths, and other exceptions. As appropriate, embodiments may consider these exceptions and eliminate repeated block mode timing constraints. Eliminating these repeated block mode timing constraints may reduce the calculation effort and thereby completes the chip design process more rapidly.

In step 730, cells are selected, buffering implemented, and cloning performed. In step 735, timing is analyzed across all modes. Since repeated block instances may be treated as modes, timing analysis may also be performed for the repeated block designs. In step 740, a determination is made whether the timing requirements have been met. If the timing requirements have not been met, the processing returns to step 730, where the process can be repeated as needed to improve the timing.

It can be desirable to have repeated block instances be identical or substantially the same. In one embodiment, a hard constraint may be placed on the design. The hard constraint may force all instances of a repeated block to be identical. In this case, all cells within the repeated block can be identical. The cell placement and wire routing may even be selected to be identical in some embodiments.

In another embodiment, a soft constraint may be placed on the design pushing repeated block instances to be similar. In this case, a cost function may be utilized to determine whether to allow one or more variations in an instance of a repeated block. Any variation between block instances may increase the cost. Therefore, the variation may only be allowed when advantageous from a timing or other perspective.

An example cost function may be illustrated as:

```
repeated_block_cost=Sum-across-all-cells
    (weighting_factor1*cell_difference+
    weighting_factor2*cell_size_difference+
    weighting_factor3*cell_buffering_difference+
    weighting_factor4*cell_cloning_difference+ . . .
    )
```

In some embodiments, variations between block instances may be analyzed to reduce the cost function while meeting other design constraints such as timing. The cost function may be a summation of each difference encountered between repeated block instances. Weighting factors may be defined by a designer, empirically determined for a specific design, or pre-selected by a software tool. The cost may be summed across all cells in the repeated block design and each difference would increase the cost function's result.

If the timing requirements have been met, in step 745, instances of a repeated block are implemented. In some embodiments, instances of a repeated block are implemented identically or substantially identically. FIG. 7 ends in step 750.

In further embodiments, input to a tool may be provided to consider multiple instances as separate modes. For example, BlockA and BlockB can be two instances of a repeated block. Each block has an input clk. The period for the input clk is 10 ns for BlockA and 15 ns for BlockB. The instances BlockA and BlockB may be tagged as modes in the following commands:

force timing clock $m/mpin:clk 10n-name clkA-mode BlockA force timing clock $m/mpin:clk 15n-name clkB-mode BlockB Accordingly, the tool can be configured to analyze each instance of a repeated block as a separate mode. An embodiment of a multimode tool may be able to handle the repeated blocks as separate modes, and consider normal modes in addition as distinct modes.

Figure 8:
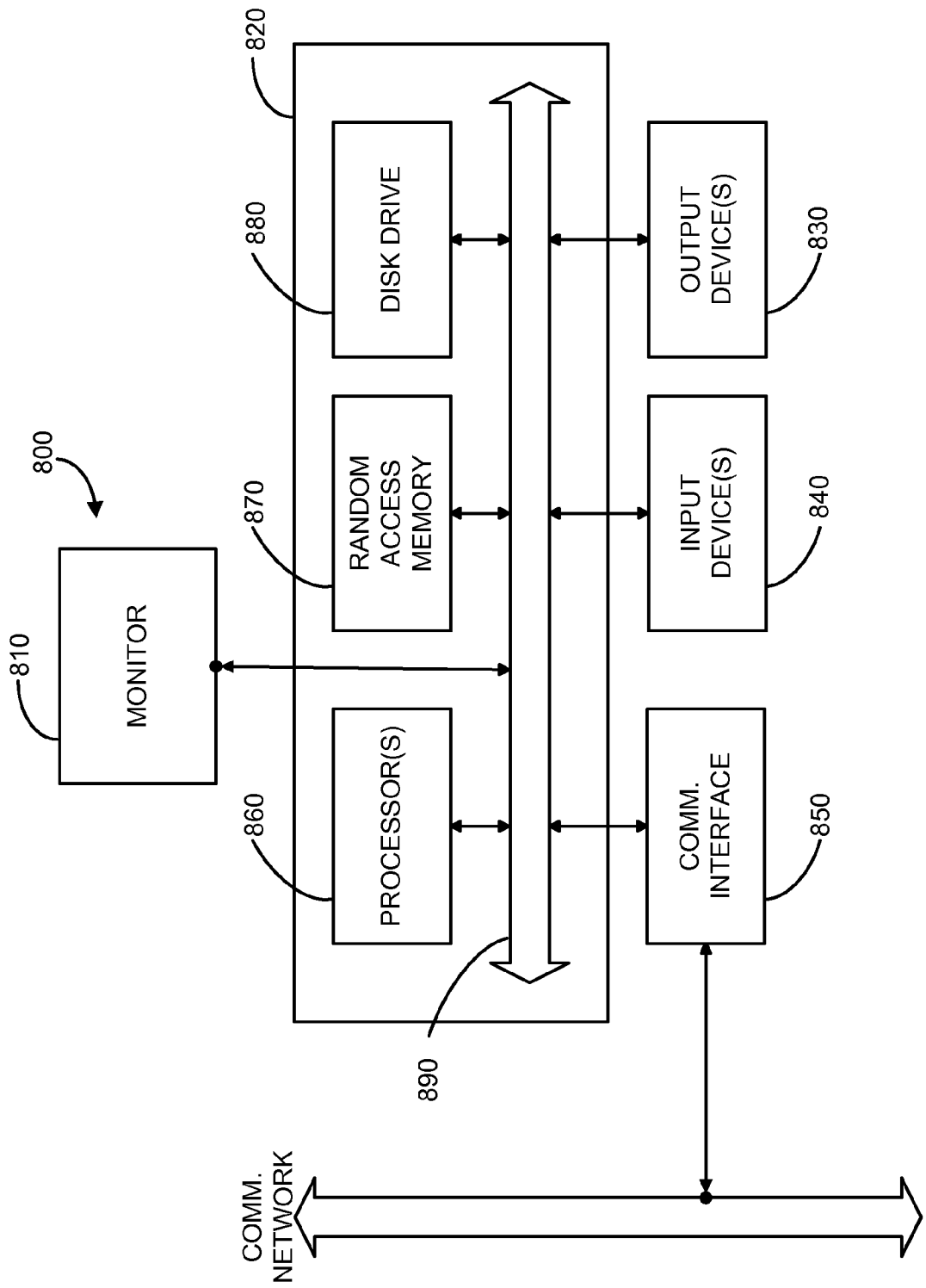
FIG. 8 is a simplified block diagram of a computer system that may incorporate embodiments of the present invention.

FIG. 8 is a simplified block diagram of a computer system that may incorporate embodiments of the present invention. FIG. 8 is merely illustrative of an embodiment incorporating the present invention and does not limit the scope of the invention as recited in the claims. One of ordinary skill in the art would recognize other variations, modifications, and alternatives.

In one embodiment, computer system 800 typically includes a monitor 810, a computer 820, user output devices 830, user input devices 840, communications interface 850, and the like.

As shown in FIG. 8, computer 820 may include a processor(s) 860 that communicates with a number of peripheral devices via a bus subsystem 890. These peripheral devices may include user output devices 830, user input devices 840, communications interface 850, and a storage subsystem, such as random access memory (RAM) 870 and disk drive 880.

User input devices 830 include all possible types of devices and mechanisms for inputting information to computer system 820. These may include a keyboard, a keypad, a touch screen incorporated into the display, audio input devices such as voice recognition systems, microphones, and other types of input devices. In various embodiments, user input devices 830 are typically embodied as a computer mouse, a trackball, a track pad, a joystick, wireless remote, drawing tablet, voice command system, eye tracking system, and the like. User input devices 830 typically allow a user to select objects, icons, text and the like that appear on the monitor 810 via a command such as a click of a button or the like.

User output devices 840 include all possible types of devices and mechanisms for outputting information from computer 820. These may include a display (e.g., monitor 810), non-visual displays such as audio output devices, etc.

Communications interface 850 provides an interface to other communication networks and devices. Communications interface 850 may serve as an interface for receiving data from and transmitting data to other systems. Embodiments of communications interface 850 typically include an Ethernet card, a modem (telephone, satellite, cable, ISDN), (asynchronous) digital subscriber line (DSL) unit, FireWire interface, USB interface, and the like. For example, communications interface 850 may be coupled to a computer network, to a FireWire bus, or the like. In other embodiments, communications interfaces 850 may be physically integrated on the motherboard of computer 820, and may be a software program, such as soft DSL, or the like.

In various embodiments, computer system 800 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 820 includes one or more Xeon microprocessors from Intel as processor(s) 860. Further, one embodiment, computer 820 includes a UNIX-based operating system.

RAM 870 and disk drive 880 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 870 and disk drive 880 may be configured to store the basic programming and data constructs that provide the functionality of the present invention.

Software code modules and instructions that provide the functionality of the present invention may be stored in RAM 870 and disk drive 880. These software modules may be executed by processor(s) 860. RAM 870 and disk drive 880 may also provide a repository for storing data used in accordance with the present invention.

RAM 870 and disk drive 880 may include a number of memories including a main random access memory (RAM) for storage of instructions and data during program execution and a read only memory (ROM) in which fixed instructions are stored. RAM 870 and disk drive 880 may include a file storage subsystem providing persistent (non-volatile) storage for program and data files. RAM 870 and disk drive 880 may also include removable storage systems, such as removable flash memory.

Bus subsystem 890 provides a mechanism for letting the various components and subsystems of computer 820 communicate with each other as intended. Although bus subsystem 890 is shown schematically as a single bus, alternative embodiments of the bus subsystem may utilize multiple busses.

FIG. 8 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

What is claimed is:

1. A method for designing an integrated circuit, the method comprising:
   receiving, at one or more computer systems, information specifying an integrated circuit that includes a plurality of instances of a repeated block;
   analyzing, with one or more processors associated with the one or more computer systems, the integrated circuit using multimode timing analysis treating each instance of the repeated block as a mode; and
   generating, with the one or more processors associated with the one or more computer systems, a design for the integrated circuit based on timing information associated with each instance of the repeated block.

2. The method of claim 1 wherein the analyzing, with the one or more processors associated with the one or more computer systems, the integrated circuit using multimode timing analysis treating each instance of the repeated block as a mode comprises treating each instance of the repeated block as a different mode.

3. The method of claim 1 further comprising:
   receiving, at the one or more computer systems, information defining a plurality of modes, wherein each mode in the plurality of modes is associated with one or more timing constraints; and
   associating, with the one or more processors associated with the one or more computer systems, each instance of the repeated block with at least one mode in the plurality of modes.

4. The method of claim 3 wherein the analyzing, with the one or more processors associated with the one or more computer systems, the integrated circuit using multimode timing analysis treating each instance of the repeated block as a mode comprises analyzing one or more timing constraints associated with an instance of the repeated block in addition to the one or more timing constraints of a mode associated with the instance of the repeated block.

5. The method of claim 1 wherein the generating, with the one or more processors associated with the one or more computer systems, the design for the integrated circuit based on the timing information associated with each instance of the repeated block comprises generating a design such that a timing constraint associated with a first instance of the repeated block affects a design implementation of a second instance of the repeated block.

6. The method of claim 5 wherein the timing constraint associated with the first instance of the repeated block differs from a timing constraint associated with the second instance of the repeated block.

7. The method of claim 1 wherein each instance of the repeated block is generated to have substantially similar timing and logic implementations.

8. The method of claim 1 further comprising:
utilizing a cost function to cause, with the one or more processors associated with the one or more computer systems, each instances of the repeated block to be similar.

9. The method of claim 1 wherein each instance of the repeated block comprises identical cells, placement, and routing.

10. A method for repeated blocks timing analysis, the method comprising:
determining, with one or more processors associated with one or more computer systems, one or more modes of operation;
defining, with the one or more processors associated with the one or more computer systems, a set of timing requirements associated with each mode in the one or more modes;
setting, with the one or more processors associated with the one or more computer systems, a set of timing constraints associated with each mode in the one or more modes;
associating, with the one or more processors associated with the one or more computer systems, at least one mode in the one or more modes with an instance of a repeated block;
selecting, with the one or more processors associated with the one or more computer systems, one or more cells, implementing buffering, and performing cloning;
analyzing, with the one or more processors associated with the one or more computer systems, timing across each of the one or more modes using multimode timing analysis; and
generating, with the one or more processors associated with the one or more computer systems, a logic optimization in standard cells based on the multimode timing analysis.

11. The method of claim 10 wherein the analyzing, with the one or more processors associated with the one or more computer systems, timing across each of the one or more modes using multimode timing analysis comprises treating the instance of the repeated block as a different mode in the one or more modes from another instance of the repeated block.

12. The method of claim 10 wherein the analyzing, with the one or more processors associated with the one or more computer systems, timing across each of the one or more modes using multimode timing analysis comprises analyzing the set of timing requirements and the set of timing constraints associated with each of the one or more modes in addition to one or more timing requirements or timing constraints associated with the instance of the repeated block.

13. The method of claim 10 wherein the generating, with the one or more processors associated with the one or more computer systems, the logic optimization in standard cells based on the multimode timing analysis comprises generating a design such that a timing constraint associated with the instance of the repeated block affects a design implementation of second instance of the repeated block.

14. The method of claim 13 wherein the timing constraint associated with the instance of the repeated block differs from a timing constraint of the another instance of the repeated block.

15. The method of claim 10 wherein each instance of the repeated block in a plurality of instances of the repeated block associated with an integrated circuit is generated to have substantially similar timing and logic implementations.

16. The method of claim 10 further comprising:
utilizing a cost function to cause, with the one or more processors associated with the one or more computer systems, each instance of the repeated block in a plurality of instances of the repeated block associated with an integrated circuit to be similar.

17. A method for repeated blocks timing analysis, the method comprising:
receiving, at one or more computer systems, information associated with a chip;
performing, with one or more processors associated with the one or more computer systems, a timing optimization on the chip;
identifying, with the one or more processors associated with the one or more computer systems, one or more repeated blocks in the chip; and
performing, with the one or more processors associated with the one or more computer systems, repeated blocks timing analysis on the chip.

18. The method of claim 17 wherein the performing, with the one or more processors associated with the one or more computer systems, repeated blocks timing analysis on the chip comprises analyzing the chip using multimode timing analysis treating each instance of a repeated block in the one or more repeated blocks as a mode.

19. The method of claim 17 further comprising:
receiving, at the one or more computer systems, information defining a plurality of modes, wherein each mode in the plurality of modes is associated with one or more timing constraints; and
associating, with the one or more processors associated with the one or more computer systems, each instance of a repeated block in the one or more repeated blocks with at least one mode in the plurality of modes.

20. The method of claim 17 wherein the performing, with the one or more processors associated with the one or more computer systems, repeated blocks timing analysis on the chip comprises analyzing timing constraints associated with an instance of a repeated block in the one or more repeated blocks in addition to one or more timing constraints of a mode associated with the instance of the repeated block.

21. The method of claim 17 wherein the performing, with the one or more processors associated with the one or more computer systems, repeated blocks timing analysis on the chip comprises utilizing a cost function to cause each instance of a repeated block in the one or more repeated blocks to be similar.

22. A non-transitory computer readable medium configured to store a set of code modules which when executed by a processor of a computer system become operational with the processor for designing an integrated circuit, the non-transitory computer readable medium comprising:
code for receiving information specifying an integrated circuit that includes a plurality of instances of a repeated block;
code for analyzing the integrated circuit using multimode timing analysis treating each instance of the repeated block as a mode; and
code for generating a design for the integrated circuit based on timing information associated with each instance of the repeated block.

23. The non-transitory computer readable medium of claim 22 wherein the code for generating the design for the integrated circuit based on the timing information associated with each instance of the repeated block comprises code for generating a design such that a timing constraint associated with a first instance of the repeated block affects a design implementation of a second instance of the repeated block.

24. A system for designing an integrated circuit, the system comprising:

a processor; and a memory coupled to the processor, the memory configured to store a plurality of instructions which when executed by the processor become operational with the processor to:

receive information specifying an integrated circuit that includes a plurality of instances of a repeated block;

analyze the integrated circuit using multimode timing analysis treating each instance of the repeated block as a mode; and generate a design for the integrated circuit based on timing information associated with each instance of the repeated block.

25. The system of claim 24 wherein the plurality of instructions further become operational with the processor to generate a design such that a timing constraint associated with a first instance of the repeated block affects a design implementation of a second instance of the repeated block.

* * * * *